United States Patent [19]

Wrathall

[11] Patent Number: 4,820,968
[45] Date of Patent: Apr. 11, 1989

[54] COMPENSATED CURRENT SENSING CIRCUIT

[75] Inventor: Robert S. Wrathall, Durham, N.C.

[73] Assignee: Harris Corporation, Melbourne, Fla.

[21] Appl. No.: 224,636

[22] Filed: Jul. 27, 1988

[51] Int. Cl.[4] .................................................. G05F 3/24
[52] U.S. Cl. ..................................... 323/316; 323/312; 330/257; 330/277
[58] Field of Search ............... 323/311, 312, 313, 314, 323/315, 316; 330/257, 277, 288

[56] References Cited

U.S. PATENT DOCUMENTS

| | | | |
|---|---|---|---|
| 4,251,743 | 2/1981 | Hareyama | 323/316 |
| 4,283,673 | 8/1981 | Lieux | 323/316 |
| 4,553,084 | 11/1985 | Wrathall | 323/314 |
| 4,769,619 | 9/1988 | Taylor | 323/316 |

Primary Examiner—Peter S. Wong
Attorney, Agent, or Firm—H. I. Schanzer; W. J. Shanley

[57] ABSTRACT

A current sensing circuit includes a first reference resistor connected in series with the source-drain path of a current mirroring transistor across the source-drain path of a power transistor which is N times the size of the current mirroring transistor. Due to the first reference resistor, the current in the mirroring transistor is less than 1/N the current in the power transistor. To sense the current in the power transistor more accurately, the current sensing circuitry includes a reference circuit in which the source-drain path of a compensating transistor, of like size as the current mirroring transistor, is connected in parallel with a second reference resistor to produce a reference current which is approximately equal to 1/N the current flowing in the power transistor.

6 Claims, 3 Drawing Sheets

COMPENSATED CURRENT SENSING CIRCUIT

BACKGROUND OF THE INVENTION

This invention relates to a current sensing circuit and more particularly to means for accurately sensing the current flowing through a power transistor.

It is often desirable and/or necessary to sense the load current flowing through a load in order to control and/or limit the load current, or to ascertain when certain current levels are reached.

It is known to sense the amplitude of a load current by placing a resistor of known value in series with the load and sensing the voltage developed across the resistor. However, where the load current is very high, this method is undesirable as it wastes power and may unduly limit the current.

The present inventor previously suggested, in U.S. Pat. No. 4,553,084, the use of a current "mirroring" transistor connected in parallel with a power transistor to sense the load current in the power transistor. The mirroring transistor is sized to be a small known ratio (i.e., 1/N) of the power transistor in order to carry 1/Nth of the current in the power transistor. A small resistor is connected to the source electrode of the "mirroring" transistor to sense the current and to generate a voltage proportional to the load current. However, as detailed below, the use of the current sensing resistor introduces a voltage offset whereby the current in the mirroring transistor is no longer proportional to the load current.

The prior art sensing circuit shown in U.S. Pat. No. 4,553,084 and problems associated therewith are best explained with reference to FIG. 1. A load, $Z_L$, is connected between an output terminal 15 and a power terminal 17, to which is applied a potential of $V_{DD}$ volts. The source-to-drain conduction path of an MOS power transistor, T1, of N-conductivity type, designed to switch the current through the load, is connected between terminal 15 and a ground terminal 13. The drain-to-source conduction path of a current "mirroring" transistor, T2, is connected between terminal 15 and a sensing node 19 and a current sensing resistor Rp is connected between terminal 19 and ground, 13. The gate electrodes of transistors T1 and T2 are connected in common to a terminal 21 to which is applied an input voltage $V_{IN}$. Transistors T1 and T2 are sized so that transistor T1 is "N" times the size of transistor T2. By way of example, the geometry of T1 may be 100 times that of T2 whereby for a like bias condition the current through T1 is 100 times that through T2. Consequently, for like bias conditions the effective impedance of T2 is "N" times that of T1.

If resistor Rp were of negligible impedance, the source of T2 would be effectively returned to ground, and the current through T2 would be 1/N times the current through T1 and track linearly. However, the presence of resistor Rp in the source path of transistor T2 causes a voltage to be generated at the source of T2 which varies as a function of the current through Rp. As the current through Rp increases the voltage at the source of transistor T2 increases, thereby decreasing the gate-to-source potential ($V_{GS}$) and the drain-to-source potential ($V_{DS}$) of T2. Since the $V_{GS}$ and $V_{DS}$ of T2 are no longer equal to the $V_{GS}$ and $V_{DS}$ of T1, the current through T2 is no longer proportional to the current through T1.

Resistor Rp may be made very small in which case the error or offset is negligible. However, there are many applications where it is impossible to make resistor Rp very small and/or if resistor Rp is made very small sensing the voltage Vp becomes difficult and subject to errors.

SUMMARY OF THE INVENTION

The problem present in the prior art is resolved in circuits embodying the invention by means of a novel reference circuit which includes means for compensating for the error due to the presence of the current sensing resistor in the source leg of the mirroring transistor.

BRIEF DESCRIPTION OF THE DRAWING

In the accompanying drawing like reference characters denote like components.

DETAILED DESCRIPTION OF THE INVENTION

Figure 2:
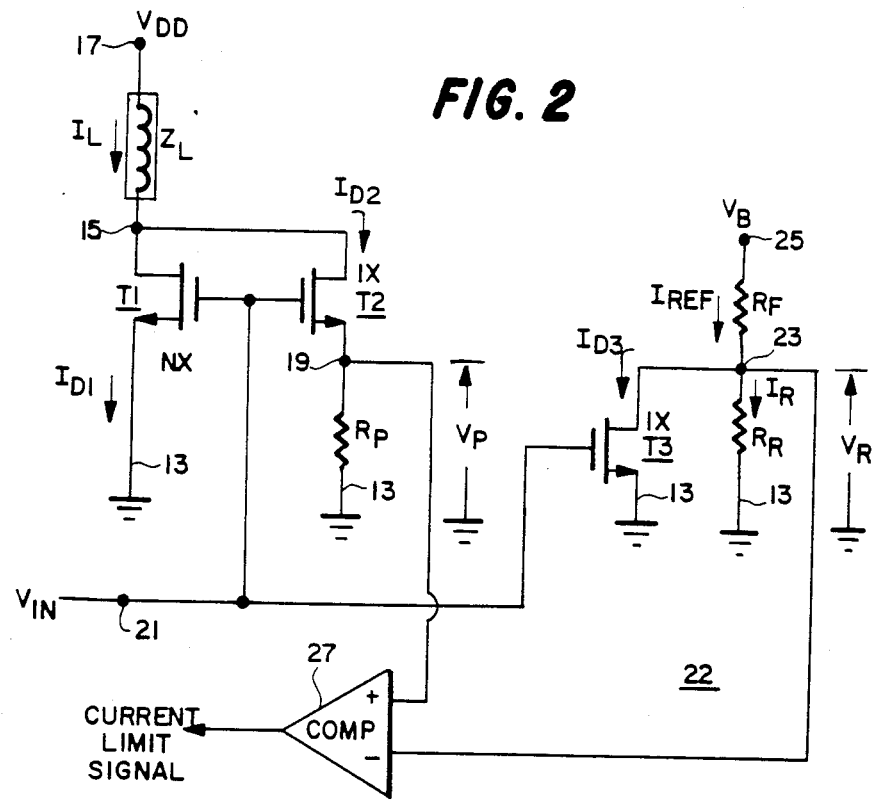
FIG. 2 is a schematic diagram of a circuit embodying the invention.

Referring to FIG. 2 there is shown an inductive load $Z_L$ connected between power terminal 17 and output terminal 15, a power MOS transistor T1 of N-conductivity type having its source-to-drain path connected between terminal 15 and ground terminal 13, a "mirroring" MOS transistor T2 of N-conductivity type having its drain-to-source path connected between terminals 15 and 19, and a resistor Rp connected between terminal 19 and ground terminal 13. In the circuit of FIG. 2, $Z_L$ is shown as an inductive load, however it should be appreciated that the load may be either resistive or reactive or be any type or combination of linear and/or non-linear loads. A compensated reference network 22 includes a current passing resistor, $R_F$, connected between a point of potential 25, to which is applied a potential of $V_B$ volts, and a reference node 23, a reference resistor $R_R$ connected between node 23 and ground, and an MOS transistor T3 having its drain-to-source conduction path connected betwen node 23 and ground terminal, 13. The gate electrodes of transistors T1, T2 and T3 are connected in common to terminal 21 to which is applied the control voltage VIN for controlling the turn-on and turn-off of these transistors. Transistors T1, T2 and T3 are of the same (e.g., N) conductivity type whereby they are turned on and off concurrently. A two-input comparator 27, which may be any one of a number of known comparator or differential amplifier circuits, is connected at one input (−) to node 23 and at the other input (+) to node 19. The trip point of comparator 27 occurs when the voltage ($V_{19}$) at node 19, and the voltage $V_{23}$, at node 23 are equal to each other. The output of comparator 27 can be used to current limit or shut down the power switch T1 or perform some other function dictated by a particular application.

For ease of the discussion to follow note that $I_L$ is the current flowing through the load $Z_L$; $I_{D1}$, is the drain-to-source current of T1; $I_{D2}$ is the drain-to-source current of T2; $I_{D3}$ or ($I_3$) is the drain-to-source current of T3; $I_{REF}$ is the current through $R_F$ and $I_R$ is the current through $R_R$.

Transistors T1, T2 and T3 are insulated-gate field effect transistors (IGFETs), each transistor having a main conduction path defined by source and drain electrodes and a gate, or control, electrode whose potential determines the conductivity of its conduction path.

In the circuit of FIG. 2, T1 is designed to be a power switch for, primarily, controlling the current through the load $Z_L$. T1 is made "N" times the size of T2 and T3 where "N" may be any number greater than one. In the circuit of FIG. 2, transistors T2 and T3 are made to have the same size whereby for like bias conditions they can conduct like currents and their effective drain-to-source impedances are substantially equal to each other. For ease of illustration in the discussion below, N is assumed to be equal to 100. However, in practice, N may be selected to be significantly greater or less than that number.

Transistor T2 is designed to mirror the current through T1. Hence for N equal to 100 and with T2 driven in a similar manner as T1, the drain-to-source current ($I_{D2}$) of T2 should be 1/N the drain-to-source current ($I_{D1}$) of T1.

The resistor Rp is used to convert the "mirrored" current into a voltage (Vp) which is proportional to, and indicative of, the current level through the load. However, as noted above and as demonstrated below, because of the current sensing resistor Rp in the source path of transistor T2, $I_{D2}$ is not equal to $I_{D1}$/N. Assume for example, that it is desired to sense when a current of 10 amperes flows through T1. With N equal to 100 and assuming Rp to be equal to 10 ohms, this would occur when a current of 0.1 ampere flows through T2. However when the current through T2 equals 0.1 ampere a Vp voltage of 1 volt is produced. With Vp equal to 1 volt the $V_{GS}$ and $V_{DS}$ of T1 is one volt less than $V_{GS}$ and $V_{DS}$ of T1. Therefore, for a current (i.e., $I_{D2}$) of 0.1 ampere flowing through T2, the current (i.e. $I_{D1}$) flowing through T1 would be significantly greater than 10 amperes.

Thus, as the current in Rp increases and the voltage Vp at the source of T2 increases, the $V_{GS}$ and $V_{DS}$ of T2 are less than the $V_{GS}$ and $V_{DS}$ of T1, causing the vurrent, $I_{D2}$, through T2 to be less than $I_{D1}$/N. Hence when, for example, Vp reaches 1 volt with 0.1 Ampere through Rp, the current $I_{D1}$ may be significantly greater than 10 amperes. If 10 ampere represents a limit level and T1 has to be turned-off at that point to prevent excessive current flow, the limit will be exceeded and a dangerous situation will result.

The importance of being able to sense and ascertain when the current through T1 is at a desired level is therefore evident.

It will now be shown that the circuit of FIG. 2 compensates for the offset due to Rp and results in the production of a reference voltage and current which is indicative of the current in transistor T1. In particular, it will be shown that the reference circuit 22 generates a reference current $I_{REF}$ which is proportional to the current $I_{D1}$ through power transistor T1.

The compensating effect of the circuit embodying the invention is best explained by reference to FIGS. 3A, 3B and 3C.

Figure 3A:
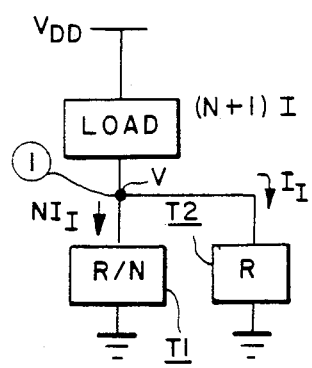
FIG. 3A is a simplified equivalent circuit diagram of a circuit including an "ideal" current mirror sensing circuit.

FIG. 3A, depicts an "ideal" condition, which indicates that if a first transistor switch, T1, having an effective impedance R/N is connected in parallel with a second transistor switch, T2, having an effective impedance R, a current $I_I$ flows through T2 and a current $NI_I$ flows through T1, whereby $NI_I(R/N)$ is equal to $I_I R$. The "ideal" current $I_I$ through T1, may be expressed mathematically as follows:

$$I_I = V/R; \qquad \text{eq. 1}$$

where

R is the effective ohmic value of the source-to-drain conduction path of T2 and

V is the voltage at node 1.

Figure 1:
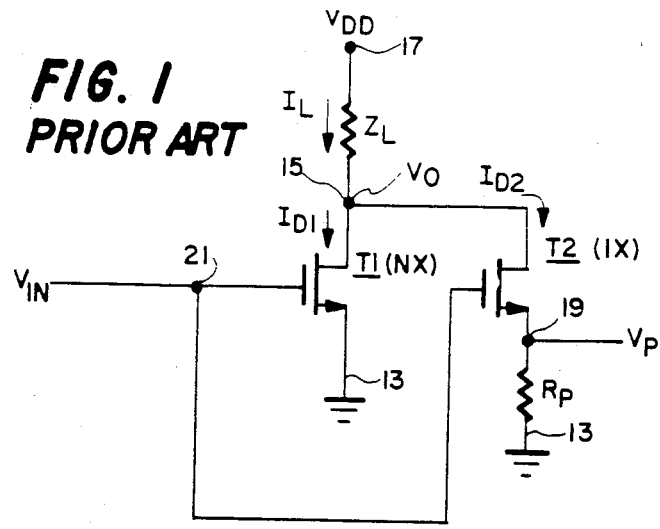
FIG. 1 is a schematic diagram of a prior art circuit.
Figure 3B:
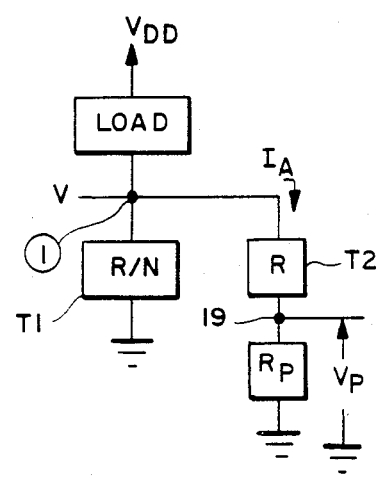
FIG. 3B is a simplified equivalent circuit diagram of the circuit of FIG. 1.

(b) FIG. 3B, depicts the "actual" condition represented by FIG. 1. It is a simplified equivalent schematic diagram of the circuit of FIG. 1 in which a resistance Rp is connected in series with the source-to-drain path of the mirroring transistor T2 to develop a voltage (Vp) indicative of the current through (T1) and the load $Z_L$. Due to the presence of Rp the actual current ($I_A$) flowing through transistor T2 is less than the "ideal" value $I_I$.

The current, $I_A$, flowing through transistor T2 may be expressed mathematically as follows:

$$I_A = V/(R+Rp) \qquad \text{eq. 2}$$

where:

V is the voltage at node 1 in FIGS. 3A and 3B and node 15 in FIGS. 1 and 2; and

R and Rp are the effective ohmic values of transistors T2, and resistor Rp, respectively.

$I_A$, is less than the ideal current $I_I$ by an error component $\Delta I$ which may be expressed as follows:

$$\Delta I = I_I - I_A \qquad \text{eq. 3}$$

Based on the simplified equivalent circuit of FIG. 3B, $I_A$ may be expressed in either of the two following ways:

$$I_A = Vp/Rp; \text{ or } I_A = V/(R+Rp) \qquad \text{eq. 4}$$

where V and Vp are the voltages at nodes 2 and 19, respectively.

The ratio of $I_A$ to $I_I$ may be expressed as follows:

$$\frac{I_A}{I_I} = \frac{V/(R+Rp)}{V/(R)} = \frac{R}{R+Rp} \qquad \text{eq. 5}$$

Therefore, $$I_A = I_I[R/(R+Rp)] \qquad \text{eq. 6a}$$

and $$I_I = I_A[(R+Rp)/R] \qquad \text{eq. 6b}$$

An examination of equations 5, 6a and 6b proves the point, discussed above, that the actual current ($I_A$) in mirroring transistor T2 is less than the "ideal" current due to the presence of Rp, and if Rp were equal to zero ohms (i.e., a negligible impedance), $I_A$ would equal $I_I$.

Figure 3C:
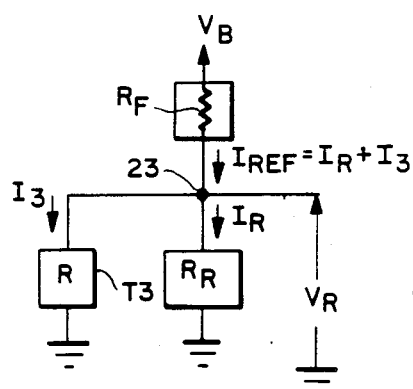
FIG. 3C is a simplified equivalent circuit diagram of the reference network 22 of FIG. 2.

Referring to the simplified equivalent diagram of reference network 22 shown in FIG. 3C, the following relationships exist:

$$I_{REF}=I_R+I_3; \quad \text{eq. 7}$$

or $$I_{REF}=(V_R/R_3)+(V_R/R_R) \quad \text{eq. 7a}$$

where:

$I_{REF}$ is the reference current through resistor $R_F$ in FIG. 2;

$I_R$ is the current through $R_R$;

$I_3$ is the compensating current through transistor $T_3$;

$R_3$ is the effective source-to-drain impedance of $T_3$; and $R_R$ is the ohmic impedance of $R_R$.

Hence the voltage $V_{23}$ or $V_R$ at node 23 may be expressed as follows:

$$I_3 R_3 = I_R R_R = V_R \quad \text{eq. 8}$$

Recall that in the circuit of FIG. 2 transistors T2 and T3 are made to have similar size (geometries) and by a similar process. Hence, their effective source-to-drain impedances are equal for like bias conditions. It may therefore be assumed that R3 of T3 is equal to R of T2. Recall also that in FIG. 2 $R_R$ is made equal to Rp.

Therefore, when $V_R$ is equal to Vp, which as, noted above, is the predetermined trip point voltage at which, for example, the load current in $Z_L$ is to be turned-off, the following relationship between $I_3$ and $I_R$ may be derived from eq. 8:

$$I_3 = I_R R_R/R_3 = V_R/R_3 \quad \text{eq. 9}$$

for $V_R=Vp$ and $R_R=Rp$ $$I_R \text{ is equal to } I_A \quad \text{eq. 10}$$

since $I_R$ is equal to $V_R/R_R$ which is equal to Vp/Rp.

By substituting the value of $I_A$ for $I_R$ in eq. 9, the current, $I_3$, in T3 may be expressed as follows:

$$I_3 = I_A (Rp/R_3) \quad \text{eq. 11}$$

for $R_3=R$, the current $I_3$ in T3 may be expressed as follows:

$$I_3 = I_A (Rp/R) \quad \text{eq. 12}$$

For $V_R=Vp$ and $R_R=Rp$ and $V_R/R_R=Vp/Rp$ eq. 7a may be rewritten as:

$$I_{REF}=(V_R/R_3)+(Vp/Rp). \quad \text{eq. 13}$$

From equation 4, Vp/Rp is equal to $I_A$. Hence, equation 13 may be rewritten as:

$$I_{REF}=(V_R/R_3)+I_A; \quad \text{eq. 14}$$

or $$I_{REF}=I_3+I_A.$$

Substituting the value of $I_3$ from equation 12 into equation 14 produces the following:

$$I_{REF}=I_A+I_A(Rp/R) \quad \text{eq. 15}$$

or $$I_{REF}=I_A[(R+Rp)/R] \quad \text{eq. 16}$$

By comparing equations 15 and 16 with equation 6b it is evident that $I_{REF}$ as derived in equations 15 and 16, is equal to the "ideal" current $I_I$.

In brief, it has been shown that by adding transistor T3 to the reference circuit the $I_{REF}$ produced in network 22 is very nearly equal to $I_I$ and hence $I_{REF}$ is approximately equal to $I_{D1}/N$. As already discussed above, when $V_R$ is equal to Vp and Rp is equal to $R_R$; $I_{REF}$ is equal to $V_R/R_R$ plus $V_R/R_3$. First, for $V_R=Vp$, $V_R/R_R$ is equal to Vp/Rp which is equal to $I_A$. Hence, $I_{REF}$ is equal to $I_A+V_R/R_3$. Secondly, $V_R/R_3$ is equal to $V_R/R$ where T3 and T2 are similarly sized and $V_R/R$ is equal to IpRp/R. Since IpRp is equal to Vp; Ip is equal to $I_A$ and IpRp/R is equal to $I_A[Rp/R]$. Therefore, $I_{REF}$ is as set forth in equations 15 and 16.

Hence it has been shown that the reference current $I_{REF}$ is equal to the "ideal" current $I_I$. Since, $I_I$ is equal to $I_{D1}/N$, $I_{REF}$ is similarly equal to $I_{D1}/N$.

Examination of the circuit of FIG. 2 reveals that the "error" due to the presence of the resistor Rp connected in series with the source-to-drain path of current mirror T2 may be compensated by connecting the source-drain path of a transistor T3 in parallel with the reference resistor $R_R$ to produce a reference current $I_{REF}$ which is proportional to the current flowing in the power transistor.

The current $I_{REF}$ is therefore indicative of the current through the load and may be used to produce more accurate results, as demonstrated by the following example.

Referring to FIG. 2 assume that Rp is equal to 250 ohms and that the size of T1=100T2=100T3.

For ease of illustration assume that in the range of operation the source-to-drain impedances of the transistors T1, T2 and T3 are in inverse ratio of their sizes.

Thus, $R_{DS}$ of T1 is 1/100 the $R_{DS}$ of T2, with the $R_{DS}$ of T2 being equal to the $R_{DS}$ of T3. The value of $I_{REF}$ can be calculated with T3 out of the circuit and with T3 connected in the circuit. In the absence of T3, for a current $I_{D2}$ equal to 2 milliamperes, and Rp equal to 250 ohms, $V_R$ would equal 0.5 volt with a reference current of 2 milliamperes. Assuming $R_{DS}$ of T2 to be equal to 500 ohms, the voltage at node 15 would equal 1.5 volt. For this condition, the $R_{DS}$ of T1 would be 5 ohms and the current $I_{D1}$ would be equal to 300 milliamperes. This represents a substantial difference or "error" in the anticipated current ratio between T1 and T2 of 100 to 1.

With T3 in the circuit, and with the $R_{DS}$ of T3 being equal to the $R_{DS}$ of T2, the condition for $V_R=Vp=0.5$ V occurs when a current of 1 milliampere flows through T3 and 2 milliamperes flow through $R_R$. Therefore, $I_{REF}$ is then equal to 3 milliampere which in fact is 1/100 or 1/N the anticipated current ratio in transistor T1.

Figure 4:
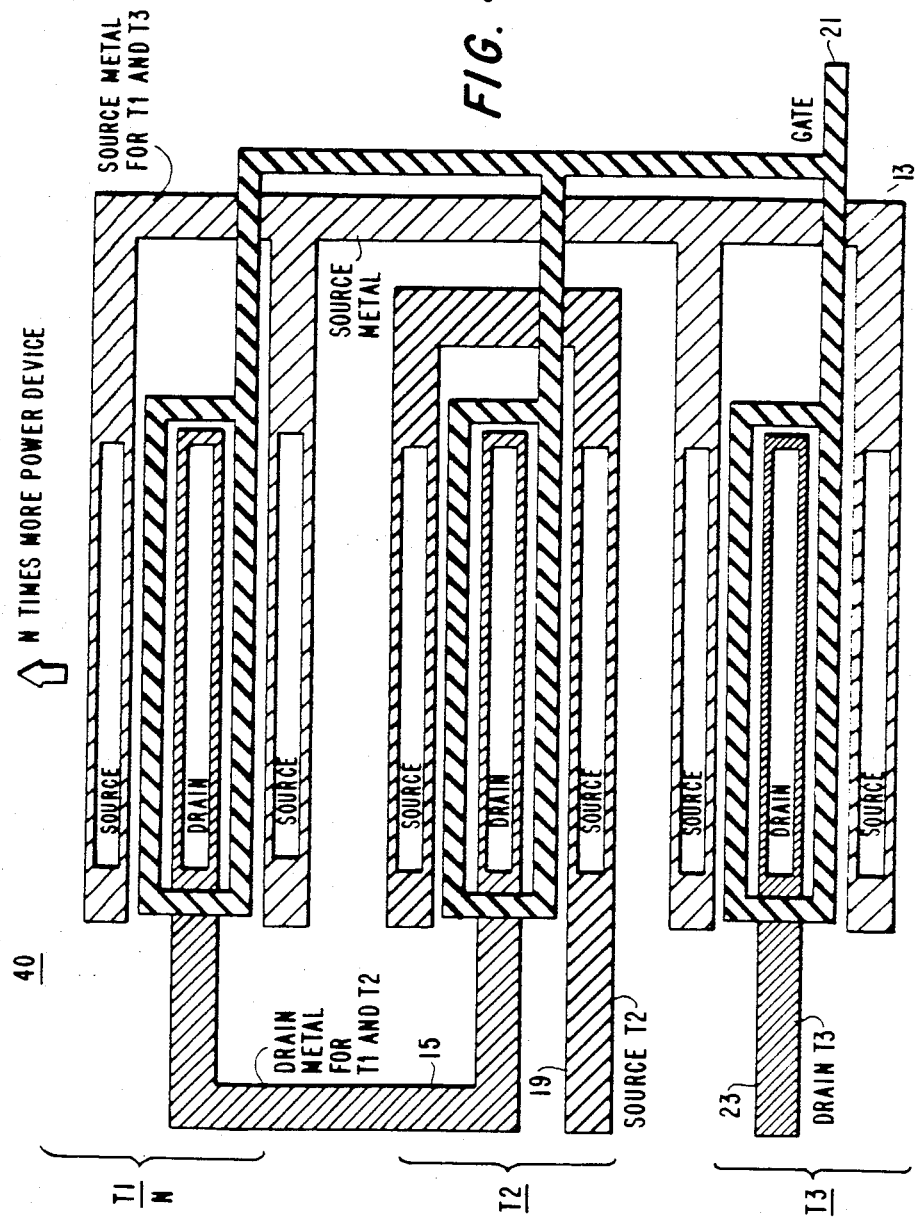
FIG. 4 is a top view of part of an integrated circuit incorporating a circuit embodying the invention.

As shown in FIG. 4, transistors T1, T2 and T3 are preferably formed on the same integrated circuit 40 to ensure that the devices (e.g., T1, T2 and T3) are made in a similar manner and are subjected to the same and/or similar environment. In addition to being formed on the same integrated circuit set that the devices are in physical proximity, the gate lengths of the devices also may be matched to ensure more effective tracking of device parameters and responses.

In the circuit of FIG. 2 and in the discussion above, it was assumed that T2 and T3 are of the same size. However, T2 and T3 may be selected or made to have different sizes if the resistors Rp and $R_R$ are correspondingly ratioed. The general relationship between the sizes of T2 and T3 and resistors Rp and $R_R$ may be expressed as follows:

$$\frac{W_{T3}}{R_R} = \frac{W_{T2}}{Rp}$$

where $W_{T2}$ and $W_{T3}$ represent the gate widths (or size) of transistors T2 and T3, respectively.

This invention has been illustrated using transistors of N conductivity type. However, it should be appreciated that transistors of different conductivity type could be used instead. Also the invention has been illustrated using field effect transistors, but the suitable switching devices could also be used.

What is claimed is:

1. The combination comprising:
  a. first and second power terminals for the application therebetween of an operating potential;
  b. means for connecting a load between said first power terminal and a first node;
  c. a first semiconductor switch having its main conduction path connected between said first node and said second power terminal for controlling the current flow through said load;
  d. means for sensing the current flowing through said load and said first semiconductor switch comprising:
    (i) a second semiconductor switch having its main conduction path connected between said first node and a second node; and
    (ii) a first impedance means connected between said second node and said second power terminal; and
  e. a reference circuit for producing a current which is proportional to the current flowing through said load comprising:
    (i) a current reference generating circuit connected between point of operating potential and a third node;
    (ii) a second impedance means connected between said third node and said second power terminal; and
    (iii) a third semiconductor switch having its main conduction path connected in parallel with said second impedance means between said third node and said second power terminal.

2. The combination as claimed in claim 1 wherein each one of said first, second and third transistors is a field-effect transistor, having a source-to-drain conduction path defining the main conduction path of each transistor and a control electrode for controlling the conductivity of its source-to-drain conduction path,
  wherein the geometry of said second transistor is similar to the geometry of said third transistor, whereby for like bias condition across gate-to-source and drain-to-source the effective impedance of their source-to-drain path is approximately equal; and
  wherein the geometry of said first transistor is "N" times the geometry of said second transistor, whereby for like bias conditions across the gate-to-source and drain-to-source the effective impedance of the source-to-drain path of the first transistor is 1/N times the effective impedance of the second transistor.

3. The combination as claimed in claim 2 wherein the same control potential is applied to the control electrodes of said first, second and third transistors.

4. The combination as claimed in claim 3, wherein the impedance of said first impedance means is equal to the impedance of said second impedance means.

5. The combination as claimed in claim 4 further including a comparator having first and second inputs,
  wherein said second node is connected to said first input of said comparator, and wherein said third node is connected to said second input of said comparator.

6. In combination with a circuit in which the conduction path of a first power transistor is connected between an output terminal and a point of reference potential, and in which the conduction path of a second sensing transistor is connected in series with a current sensing resistor across the conduction path of the first power transistor, and wherein the geometry of the sensing transistor is designed to be 1/N times the geometry of the first power transistor in order to carry 1/N times the current flowing in the power transistor, but wherein due to the presence of the current sensing resistor the current flowing through the sensing transistor is offset, being less than 1/N times the current through the first power transistor, an improved reference circuit for producing a compensated reference current which is more nearly proportional to the current in said power transistor comprising:
  a current source for applying a current into a node;
  a reference resistor having the same value as said current sensing resistor connected between said node and said point of reference potential; and
  a third compensating transistor having a similar geometry to that of said second sensing transistor and having its main conduction path connected in parallel with said reference resistor.

* * * * *